US007537940B2

(12) United States Patent
Lee et al.

(10) Patent No.: US 7,537,940 B2
(45) Date of Patent: May 26, 2009

(54) METHOD OF MANUFACTURING ELECTRONIC DEVICE CAPABLE OF CONTROLLING THRESHOLD VOLTAGE AND ION IMPLANTER CONTROLLER AND SYSTEM THAT PERFORM THE METHOD

(75) Inventors: Young-Ho Lee, Gyeonggi-do (KR); Sun-Yong Lee, Seoul (KR); Doo-Heun Baek, Gyeonggi-do (KR); Tae-Hoon Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 528 days.

(21) Appl. No.: 11/053,651

(22) Filed: Feb. 7, 2005

(65) Prior Publication Data

US 2005/0176225 A1    Aug. 11, 2005

(30) Foreign Application Priority Data

Feb. 6, 2004    (KR) ............... 10-2004-0008059

(51) Int. Cl.
*H01L 21/66* (2006.01)
(52) U.S. Cl. .................................. 438/14
(58) Field of Classification Search .......... 438/6, 438/10, 104, 107–114, 118, 121–123, 128–129, 438/135, 142, 145, 149, 151, 157, 176, 478, 438/184, 193, 195–198, 200–203, 206–207, 438/209–211, 218, 237, 165, 294, 308, 337, 438/353
See application file for complete search history.

(56) References Cited

U.S. PATENT DOCUMENTS 6,482,660 B2    11/2002    Conchieri et al.
6,812,045 B1 *  11/2004    Nikoonahad et al. .......... 438/14
6,946,394 B2 *   9/2005    Fielden et al. .............. 438/680
2002/0102749 A1* 8/2002    Fielden et al. ............... 438/14

(Continued)

FOREIGN PATENT DOCUMENTS

JP    2002-118041    4/2002

(Continued)

OTHER PUBLICATIONS

English language abstract of Korean Unexamined Patent No. 1997-63478.

(Continued)

*Primary Examiner*—Charles D. Garber
*Assistant Examiner*—Andre' C Stevenson
(74) *Attorney, Agent, or Firm*—Marger Johnson & McCollom, P.C.

(57) ABSTRACT

A method of manufacturing an electronic device, which can obtain sufficient manufacturing margins and reduce a defect rate by compensating for a threshold voltage variation caused by the variation of a critical dimension (CD) of a gate electrode. An ion implanter controller and an ion implantation system perform the method. In the method, an ion implantation recipe for forming a junction contact plug of a transistor formed on the wafer is adjusted based on the measured CD. Then, ions are implanted into the wafer by using the adjusted ion implantation recipe. All defects that may occur in the transistor during previous manufacturing steps can be repaired after the transistor is formed, thus enhancing manufacturing margins.

27 Claims, 11 Drawing Sheets

U.S. PATENT DOCUMENTS

| | | | |
|---|---|---|---|
| 2003/0011786 A1* | 1/2003 | Levy et al. | 356/600 |
| 2003/0180972 A1 | 9/2003 | Al-Bayati et al. | |
| 2004/0092045 A1* | 5/2004 | Bultman et al. | 438/16 |
| 2004/0115843 A1* | 6/2004 | Wack et al. | 438/14 |
| 2004/0235205 A1* | 11/2004 | Levy et al. | 438/14 |

FOREIGN PATENT DOCUMENTS

| | | |
|---|---|---|
| KR | 1997-63478 | 9/1997 |

OTHER PUBLICATIONS

English language abstract of Japanese Patent No. 2002-118041.

* cited by examiner

METHOD OF MANUFACTURING ELECTRONIC DEVICE CAPABLE OF CONTROLLING THRESHOLD VOLTAGE AND ION IMPLANTER CONTROLLER AND SYSTEM THAT PERFORM THE METHOD

This application claims priority from Korean Patent Application No. 10-2004-0008059 filed on Feb. 6, 2004 with the Korean Intellectual Property Office, the disclosure of which is incorporated herein in its entirety by reference.

BACKGROUND OF THE INVENTION

1. Field of the Invention

The present invention relates to a method of manufacturing an electronic device capable of controlling a threshold voltage, and an ion implanter controller and system that perform the method.

2. Description of the Related Art

Generally, ion implantation for manufacturing an electronic device is performed according to a predetermined ion implantation recipe composed of various ion implantation variables. But the various ion implantation variables are typically fixed regardless of a variation in the critical dimension (CD) of a gate electrode that has already been formed before the ion implantation. However, the variation of the CD of the gate electrode is one of the most critical factors determining the static and/or dynamic performance of an entire electronic device.

According to methods disclosed in the related arts, a gate electrode is formed on a wafer, the CD of the gate electrode is measured, an ion implantation recipe for forming impurity regions, i.e., a lightly doped drain (LDD) region and a source/drain region is adjusted, and ion implantation is performed according to the adjusted ion implantation recipe.

However, such conventional methods only compensate for a variation in the effective length of a channel that occurs due to the variation of the CD of the gate electrode. Yet, the variation of the CD of the gate electrode causes a threshold voltage as well as the effective length of the channel to vary. Therefore, it is impossible to sufficiently compensate for threshold voltage variations caused by the variation of the CD of the gate electrode by simply adjusting the ion implantation recipe, which only affects the effective length of the channel. Accordingly, it is still impossible to prevent static and/or dynamic refresh failures caused by the variation of the CD of the gate electrode from occurring.

SUMMARY OF THE INVENTION

The present invention provides a method of manufacturing an electronic device capable of effectively compensating for threshold voltage variations triggered by critical dimension (CD) variations.

The present invention also provides an ion implanter controller used in the method of manufacturing an electronic device capable of effectively compensating for threshold voltage variations triggered by critical dimension (CD) variations.

Further, the present invention provides a system used for the method of manufacturing an electronic device capable of effectively compensating for threshold voltage variations triggered by critical dimension (CD) variations.

According to an aspect of the present invention, a method of manufacturing an electronic device includes measuring a critical dimension (CD) of a gate electrode formed on a wafer; adjusting an ion implantation recipe for forming a junction contact plug of a transistor formed on the wafer, based on the measured CD; and implanting ions into the wafer to form the junction contact plug using the adjusted ion implantation recipe.

According to another aspect of the present invention, an ion implanter controller comprises a measurement device adapted to measure a CD of a gate electrode formed on a wafer; an ion implantation recipe adjustment unit structured and arranged to adjust an ion implantation recipe for forming a junction contact plug of a transistor based on the measured CD of the gate electrode; and a transmission unit structured and arranged to transmit an operational command modified according to the adjusted ion implantation recipe to an ion implanter.

According to still another aspect of the present invention, an ion implantation system comprises a measurement device adapted to measure a CD of a gate electrode formed on a wafer; an ion implanter controller structured and arranged to adjust an ion implantation recipe for forming a junction contact plug of a transistor based on the measured CD of a gate electrode, and adapted to transmit an operational command modified according to the adjusted ion implantation recipe to an ion implanter; and the ion implanter adapted to perform junction contact plug ion implantation according to the operational command.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE PREFERRED EMBODIMENTS

Figure 1:
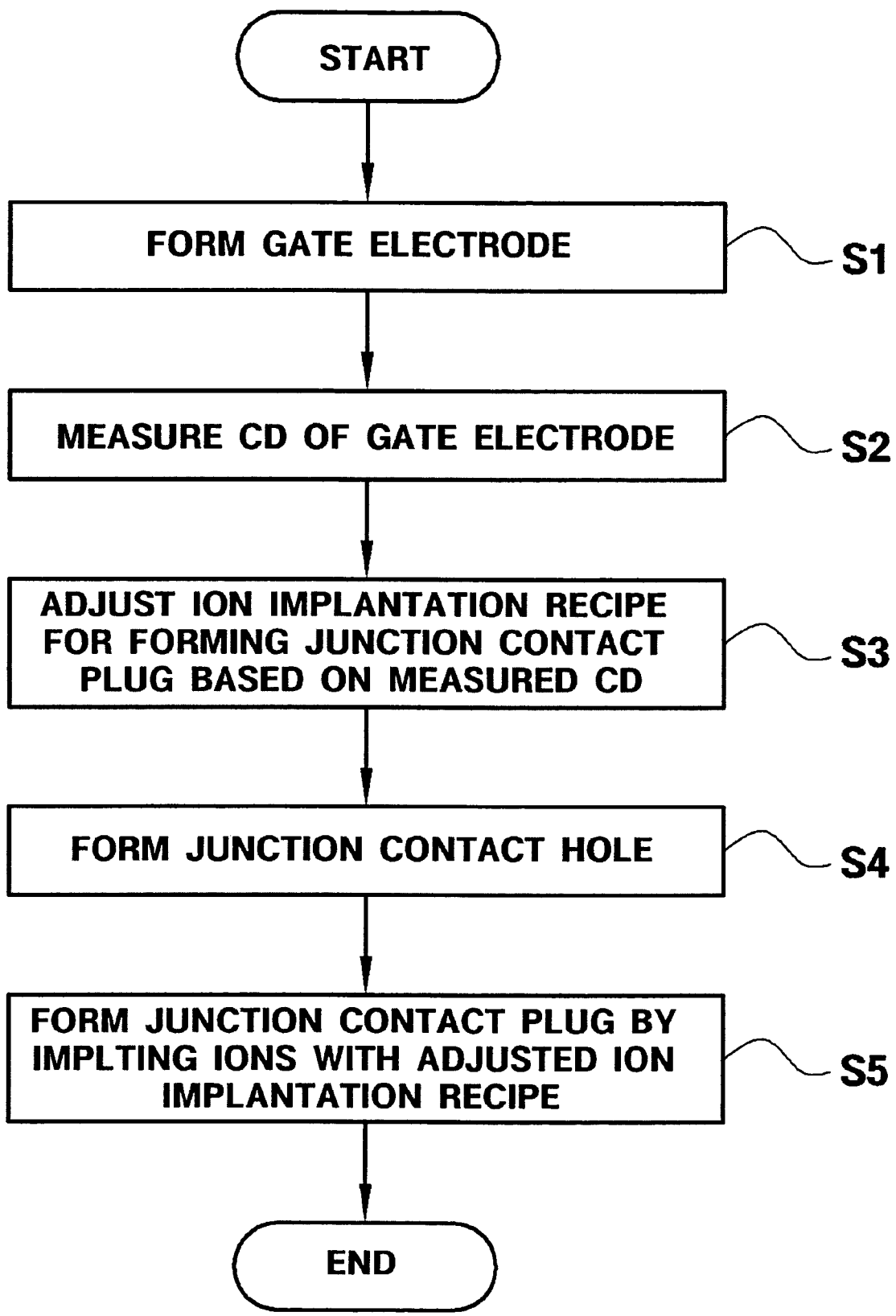
FIG. 1 is a flowchart of a method of manufacturing an electronic device according to an exemplary embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. The spirit and scope of the invention is defined by the appended claims. In the drawings, the same reference numerals denote the same member. Throughout the specification, the terms "first conductivity type" and "second conductivity type" denote opposite conductivity types, like n- and p-type. The respective illustrative embodiments of the invention encompass complementary examples thereof. In several embodiments of the invention, well known methods involving well-known circuits, components, techniques, etc., have not been described in detail so as not to unnecessarily obscure aspects of the present invention.

The present invention discloses a method of controlling a threshold voltage of a transistor formed on a semiconductor substrate, and an ion implantation system and an ion implanter controller that perform the method.

According to an embodiment of the present invention, a gate electrode is formed, and then a critical dimension (CD) of the gate electrode is measured. Thereafter, the measured CD of the gate electrode is fed forward to the ion implanter controller. Thereafter, the ion implanter controller determines an ion implantation recipe based on the measured CD of the gate electrode.

Preferably, but not necessarily, the CD of the line width of the gate electrode is measured, and an ion implantation recipe for forming a junction contact plug of a transistor is adjusted based on the measured critical dimension of the line width of the gate electrode. Thereafter, the ion implantation recipe is input to an ion implanter. The ion implanter sets a threshold voltage of the transistor as a target threshold voltage by implanting ions into the junction contact plug of the transistor in accordance with the ion implantation recipe.

A method of manufacturing an electronic device according to the present invention can be applied to a highly integrated semiconductor memory device, such as a DRAM, an SRAM, a flash memory, an FRAM, an MRAM, or a PRAM; a microelectro mechanical system (MEMS) device, an optoelectronic device, a display device, and a processor, such as a CPU or a DSP, and the like.

A silicon wafer, a silicon-on-insulator (SOI) wafer, a gallium arsenide (GaAs) wafer, a silicon germanium wafer, a ceramic wafer, or a quartz wafer can be used as a wafer on which an electronic device according to an aspect of the present invention is formed. However, the electronic device according to one embodiment of the present invention may be formed on a wafer or substrate other than those set forth herein.

The present invention will now be described more fully with reference to the accompanying drawings, in which exemplary embodiments of the present invention are shown.

Figure 2:
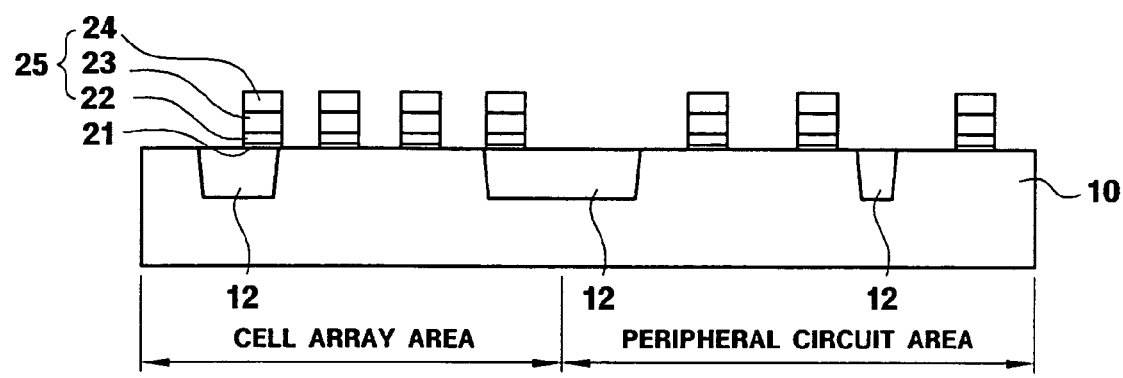
FIG. 2 is a cross-sectional view illustrating operation S1 of the method of manufacturing an electronic device of FIG. 1.
Figure 3:
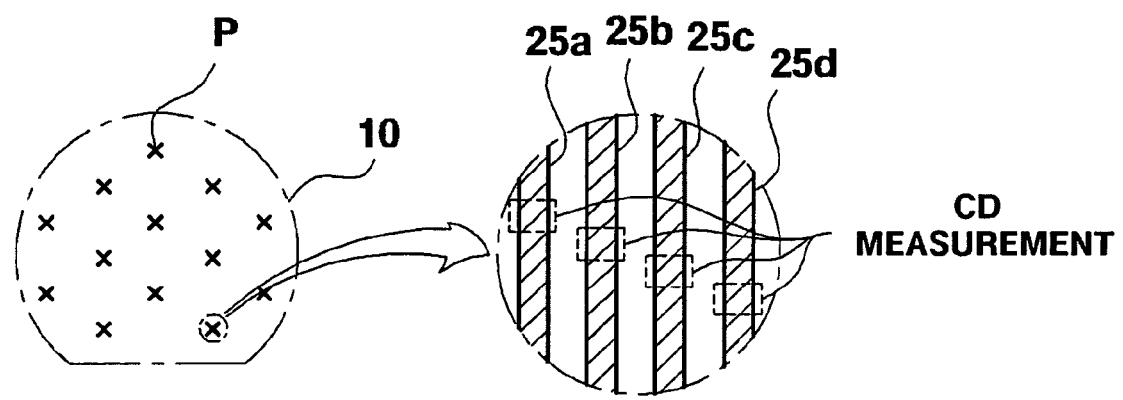
FIG. 3 is a schematic diagram illustrating operation S2 of the method of manufacturing an electronic device of FIG. 1.
Figure 4:
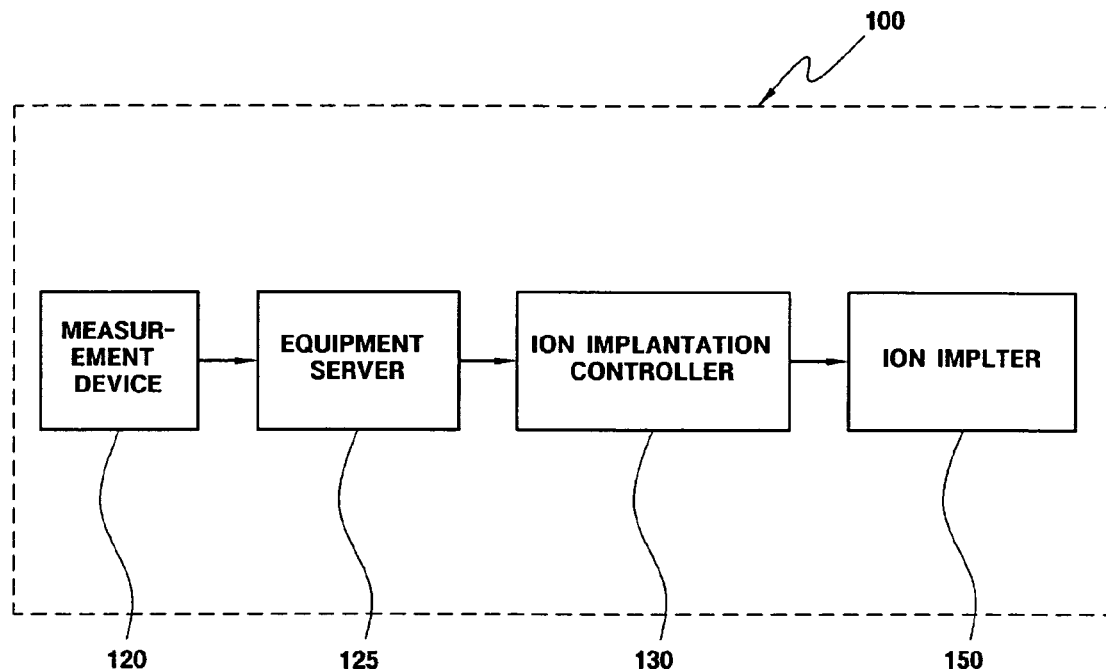
FIG. 4 is a block diagram of an ion implantation system according to an exemplary embodiment of the present invention, which is used in the method of manufacturing an electronic device of FIG. 1.
Figure 5A:
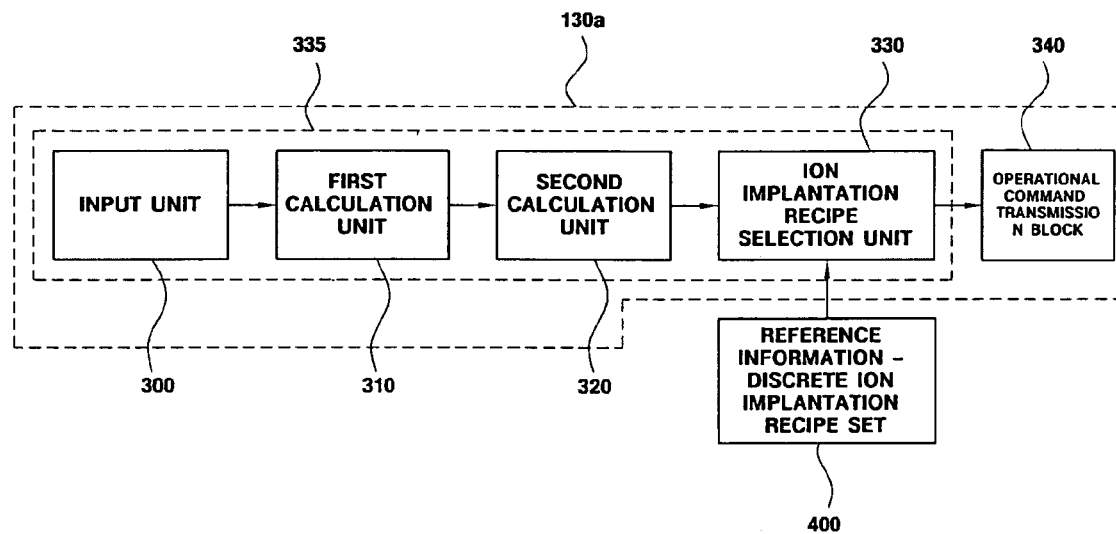
FIGS. 5A and 5B are block diagrams of the two embodiments of an ion implanter controller of the ion implantation system of FIG. 4.
Figure 5B:
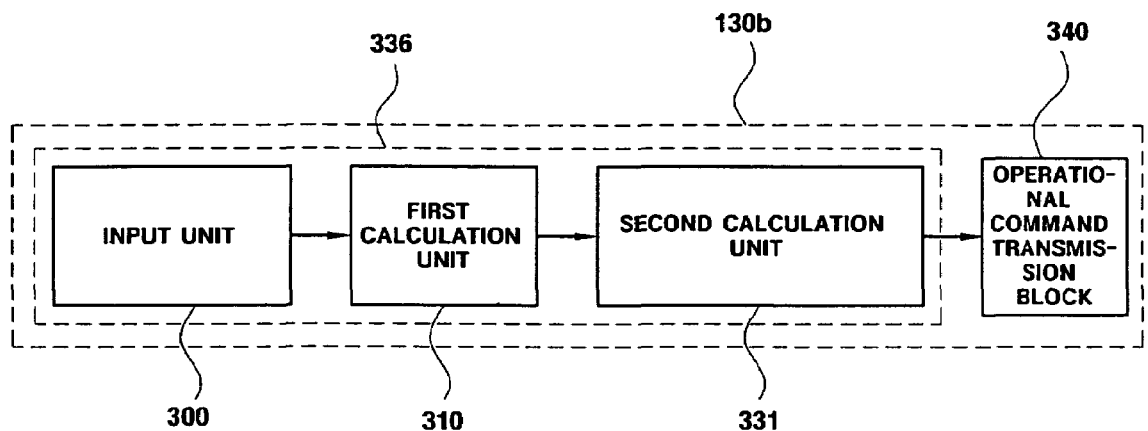
Figure 6:
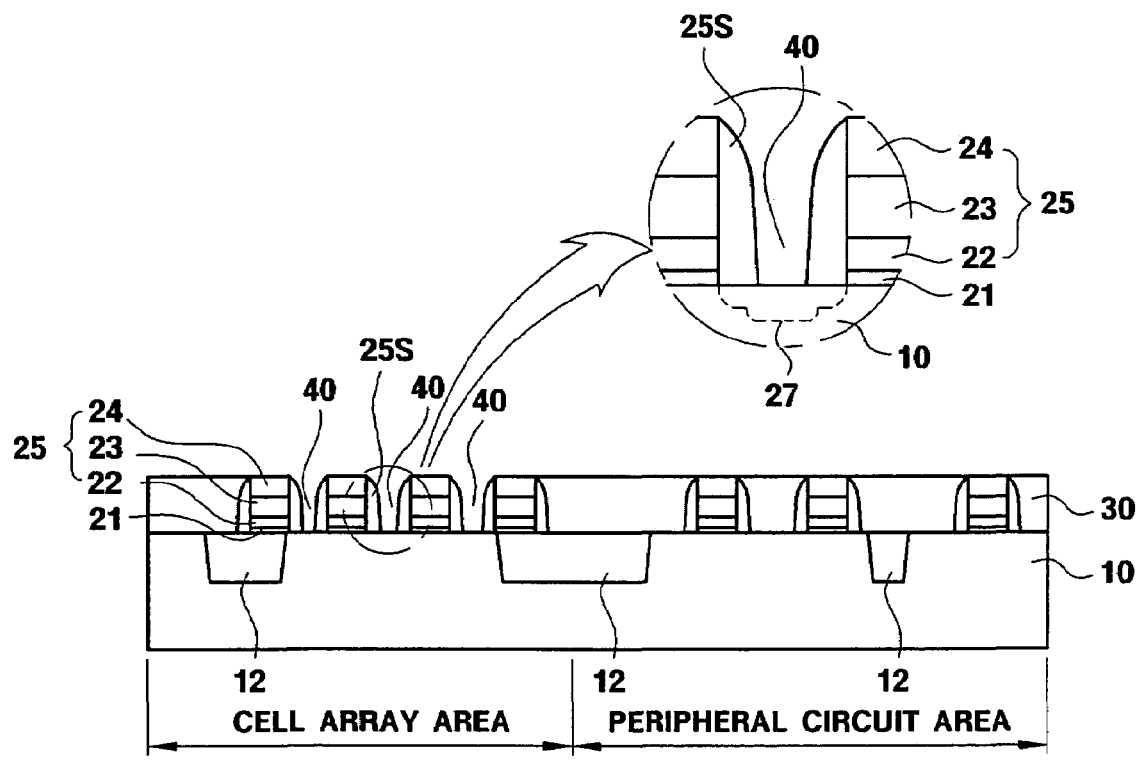
FIG. 6 is a cross-sectional view illustrating an operation S4 of the method of manufacturing an electronic device of FIG. 1.
Figure 7:
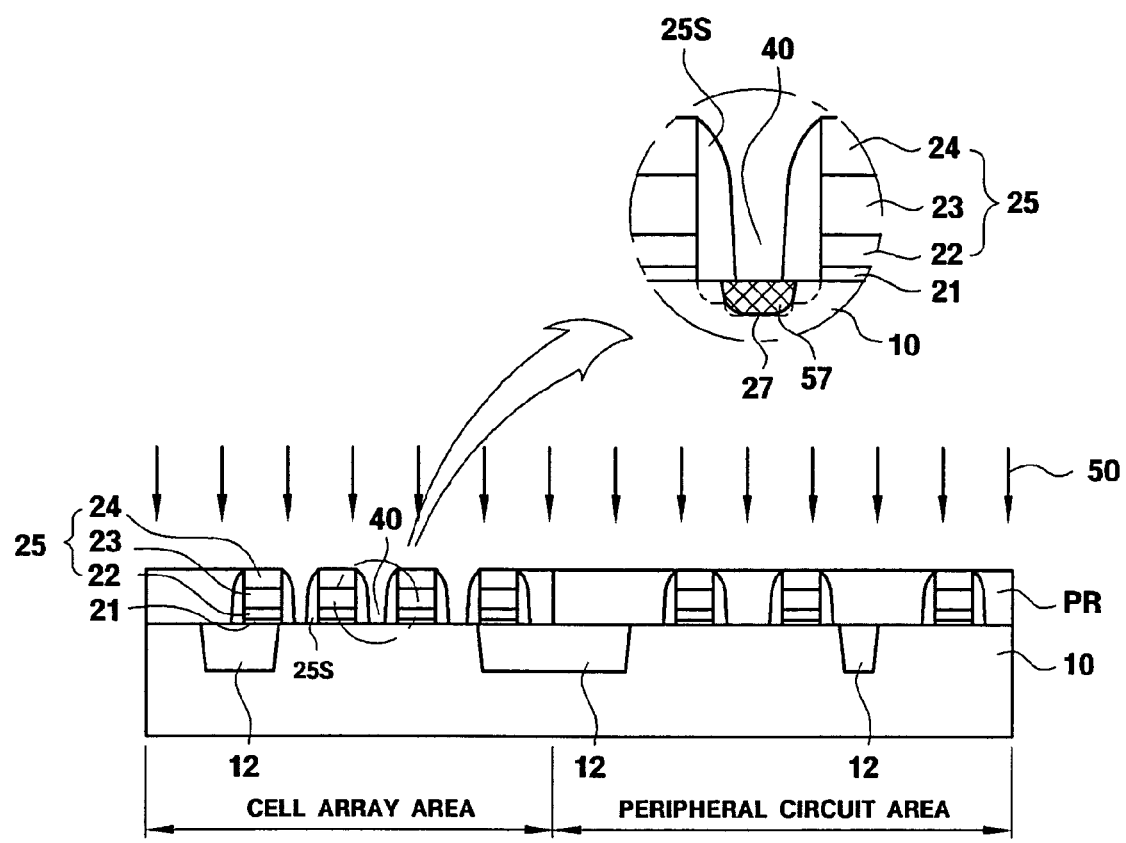
FIG. 7 is a cross-sectional view illustrating an operation S5 of the method of manufacturing an electronic device of FIG. 1.

FIG. 1 is a flowchart of a method of manufacturing a memory device according to an exemplary embodiment of the present invention; FIGS. 2 and 3 are cross-sectional views illustrating operations S1 and S2 of the method of manufacturing a memory device of FIG. 1; FIG. 4 is a block diagram of an ion implantation system used to perform the method of manufacturing a memory device of FIG. 1; FIGS. 5A and 5B are block diagrams of ion implanter controllers according to exemplary embodiments of the present invention that constitute their respective ion implantation systems; and FIGS. 6 and 7 are cross-sectional views illustrating operations S4 and S5 of the method of manufacturing a memory device of FIG. 1. In the following paragraphs, a memory device will be taken as an example of an electronic device according to the present invention, and a silicon wafer will be taken as an example of a wafer on which the electronic device according to the present invention is formed.

Referring to FIGS. 1 and 2, a gate electrode is formed on a wafer in operation S1. As shown in FIG. 2, a shallow trench isolation (STI) region 12 is formed in a wafer 10 of a first conductivity type, i.e., a p-type wafer, so that an active region can be defined in the wafer 10. Thereafter, a gate insulation layer 21 and a gate electrode 25 are formed on the wafer 10. The gate insulation layer 21 may be composed of an oxide layer, a thermally grown silicon dioxide layer, Silk®, polyimide, or a high-k dielectric material such as $ZrO_2$ or $HfO_2$. The gate insulation layer 21 may be formed of an oxide layer by dry oxidation at a temperature between 1000° C. and 1100° C. by using an oxygen ($O_2$) gas, by wet oxidation at a temperature between 1000° C. and 1100° C. in a water vapor atmosphere, by HCl oxidation by using a mixture of $O_2$ gas and HCl gas, through oxidation by using a mixture of $O_2$ gas and $C_2H_3Cl_3$ gas, or by oxidation using a mixture of $O_2$ gas and $C_2H_2Cl_2$ gas. Alternatively, the gate insulation layer 21 may be formed of a high k-dielectric material, such as $Al_2O_3$, $Ta_2O_5$, $HfO_2$, $ZrO_2$, hafnium silicate, zirconium silicate, or any combination thereof, using an atomic layer deposition method.

Thereafter, a conductive layer is formed on the gate insulation layer 21. The conductive layer may be composed of a doped polysilicon layer, a metallic layer, or a double layer including the doped polysilicon layer and the metallic layer, or a double layer including the doped polysilicon layer and a metal silicide layer. The metallic layer may be a tungsten layer, a cobalt layer, or a nickel layer, and the metal silicide layer may be a tungsten silicide layer, a cobalt silicide layer, or a nickel silicide layer. The doped polysilicon layer may be formed by a low pressure chemical vapor deposition (LPCVD) method by using $SiH_2Cl_2$ gas and $PH_3$ gas. The tungsten silicide layer may be formed by the LPCVD method using $SiH_2Cl_2$ gas and $WF_6$ gas. FIG. 2 illustrates a case where the conductive layer comprises a doped polysilicon layer 22 and a silicide layer 23.

A capping layer 24 is formed on the conductive layer, and then a gate electrode 25 is formed by patterning the capping layer 24, the conductive layer 22 and 23, and the gate insulation layer 21 using a typical photolithography and etching processes.

Thereafter, a CD of the gate electrode 25 is measured in operation S2.

The measuring is performed after the gate electrode 25 is formed using a measurement device as explained below and then cleaned. One or two wafers are sampled per each lot, and then CDs of more than one gate electrode formed on the sampled wafers are measured. More specifically, as shown in FIG. 3, a plurality of measurement positions P are determined on the wafer 10. The number of measurement positions P may vary depending on the size of the wafer 10. For example, if the diameter of the wafer 10 is 8 inches, a total of 5 measurement positions may be determined on the wafer 10. If the diameter of the wafer 10 is 12 inches, a total of 13 measurement positions may be determined on the wafer 10. However, the number of measurement positions P is not restricted to those set forth herein.

Thereafter, CDs of two or more adjacent gate electrodes are measured at each of the measurement positions P. Preferably, but not necessarily, CDs of four adjacent gate electrodes 25a, 25b, 25c, and 25d are measured at each of the measurement positions P and then are averaged, thereby enhancing the precision of the CD measurement. The measured CDs of the four adjacent gate electrodes 25a through 25d are line widths of the four adjacent gate electrodes 25a through 25d.

The CD of the gate electrode 25 is measured by a measurement device 120 of an ion implantation system 100, which is illustrated in FIG. 4. A mechanical measurement device, such as a scanning electron microscopy (SEM) device, an atomic force microscopy (AFM) device, a reflectance measurement device, or an interference measurement device, may be used as the measurement device 120. However, the measurement device 120 is not restricted to such devices. A non-mechanical measurement device may also be used as the measurement device 120.

Thereafter, in operation S3 of FIG. 1, a junction contact plug ion implantation dose is adjusted based on the measured CD of the gate electrode 25.

The ion implantation recipe is adjusted by an ion implanter controller 130 of the ion implantation system 100.

Measured CDs of gate electrodes, which are yet to be processed, are transmitted to and collected by an equipment server 125, which adjusts equipment.

Then, the measured CDs of the gate electrodes collected by the equipment server 125 are input to the ion implanter controller 130. The ion implanter controller 130 adjusts the transistor junction contact plug ion implantation recipe based on the measured CDs of the gate electrodes input thereto. The ion implantation recipe adjusted by the ion implanter controller 130 may be an ion implantation dose, ion implantation energy, ion implantation tilt angle, or any combination thereof.

For example, the ion implanter controller 130 determines an appropriate ion implantation recipe based on the measured CD of the gate electrode 25 by referring to a table generated using one or more equations, graphs, and/or computer simulation packages. Here, the one or more equations, graphs, and/or computer simulation packages express experimentally determined correlations between ion implantation doses and CDs of gate electrodes. Thereafter, the ion implanter controller 130 issues a command to modify an existing ion implantation recipe to an ion implanter 150 (of FIG. 4). Preferably, but not necessarily, a threshold voltage of transistor is adjusted by adjusting an ion implantation dose.

Examples of the ion implanter controller 130, i.e., ion implanter controllers 130a and 130b are illustrated in FIGS. 5A and 5B, respectively.

Referring to FIG. 5A, the exemplary embodiment of the ion implanter controller 130a comprises an ion implantation recipe adjustment block 335 and an operational command transmission block 340.

The ion implantation recipe adjustment block 335 includes an input unit 300, a first calculation unit 310, a second calculation unit 320, and a recipe selection unit 330. However, the ion implanter controller 130a may have a different structure from the one illustrated in FIG. 5A. All of the blocks of the ion implantation controller 130a and all of the units of the ion implantation recipe adjustment block 335 of the ion implantation controller 130a are connected to one another via buses (not shown) so that data can be stored in, retrieved from, or processed by the ion implanter controller 130a.

The input unit 300 receives CDs of two or more adjacent gate electrodes measured at each of the measurement positions P, which are measured by the measurement device 120 and then collected by the equipment server 125. The first calculation unit 310 averages the CDs of the two or more adjacent gate electrodes corresponding to each of the measurement positions P and averages the resulting CD averages of the measurement positions P, thereby obtaining a final CD. The second calculation unit 310 obtains a difference ACD between the final CD and a target CD. The recipe selection unit 330 selects an ion implantation recipe (e.g., an ion implantation recipe R3) from a set of discrete ion implantation recipes R1 through Rn, represented by block 400 in FIG. 5A. These recipes are quantified to compensate for a threshold voltage of a transistor with respect to each equally divided section that may be obtained by dividing a maximum CD variation range within a manufacturing specification with a constant interval. The operational command transmission unit 340 transmits the selected ion implantation recipe, i.e., the ion implantation recipe R3, to the ion implanter 150.

Referring to FIG. 5B, the ion implantation controller 130b comprises an ion implantation recipe adjustment block 336 and an operational command transmission block 340.

The ion implantation recipe adjustment block 336 includes an input unit 300, a first calculation unit 310, and a second calculation unit 331. The ion implantation recipe adjustment unit 336 is different from the ion implantation recipe adjustment unit 335 in that the second calculation unit 331 is composed of a mathematical model that can result in the same junction contact plug ion implantation effect as when using a target CD of the gate electrode 25, by using a final CD calculated by the first calculation unit 310 as an insertion variable.

The mathematical model comprising the second calculation unit 331 may be one or more equations, graphs, and/or computer simulation packages, which express experimentally determined correlations between ion implantation doses and CDs of gate electrodes. For example, in the case of implanting ions into a self-aligned contact (SAC) plug of a DRAM, Equation (1) below can be used as the mathematical model of which the second calculation unit 331 is comprised.

Junction contact plug ion implantati on dose =((0.5× measured CD of gate electrode (nm))−67.3)× $E12$.

A junction contact hole is formed in the wafer 10 in operation S4 of FIG. 1 at the same time as or after adjusting the ion implantation dose in operation S3.

Referring to FIG. 6, a junction region 27 of a transistor is formed in the wafer 10. The junction region 27 denotes a source/drain region of the transistor.

More specifically, a lightly doped drain (LDD) region is formed by implanting impurities of a second conductivity type, i.e., n-type impurities, into the wafer 10, which already has p-type impurities doped therein, by using the gate electrode 25 as a mask. Thereafter, spacers 25S are formed at sidewalls of the gate electrode 25. Thereafter, n-type impurities are implanted with a higher energy than the energy used to form the LDD region, thus forming an n+ source/drain region and then completing the junction region 27.

Thereafter, an interlayer insulation layer 30 is formed to cover the wafer 10 and is then planarized. Thereafter, an SAC hole 40 is formed on the wafer 10 by photolithography and etching processes. The SAC hole 40 is self-aligned with the spacers 25S and exposes the junction region 27.

FIG. 6 illustrates the formation of the SAC hole 40. However, the present invention can also be applied to a contact hole formed in the interlayer insulation layer 30 to expose the junction region 27.

In operation S5 of FIG. 1, junction contact plug ions are implanted by using an ion implantation recipe adjusted in operation S3.

More specifically, referring to FIG. 7, impurity ions 50 are implanted into the junction region 27 exposed by the SAC hole 40. The impurity ions 50 may be impurities of the same conductivity type as the junction region 27, i.e., n-type impurity ions.

The ion implanter 150 of FIG. 4 implants n-type impurity ions into the junction region 27 following the ion implantation recipe adjusted by the ion implanter controller 130 of FIG. 4.

The above exemplary embodiments of the present invention deal with an occasion when the ion implantation system 100 includes the measurement device 120, the equipment server 125, the ion implanter controller 130, and the ion implanter 150. However, only the ion implanter controller 130 and the ion implanter 150 may constitute the ion implantation system 100, and the measurement device 120 and the equipment server 125 may constitute another system. Alternatively, the ion implanter controller 130 and the ion implanter 150 may be provided as separate elements of the ion implantation system 100, or the ion implanter controller 130 may be installed in the ion implanter 150.

Threshold voltage variations with respect to CD variations can be effectively controlled by adjusting an ion implantation recipe for forming a junction contact plug of a transistor. This will now be described more fully with reference to various experimental results. Techniques which are closely related to the present invention but are not mentioned in this disclosure are also considered obvious to the one skilled in the art.

Figure 8A:
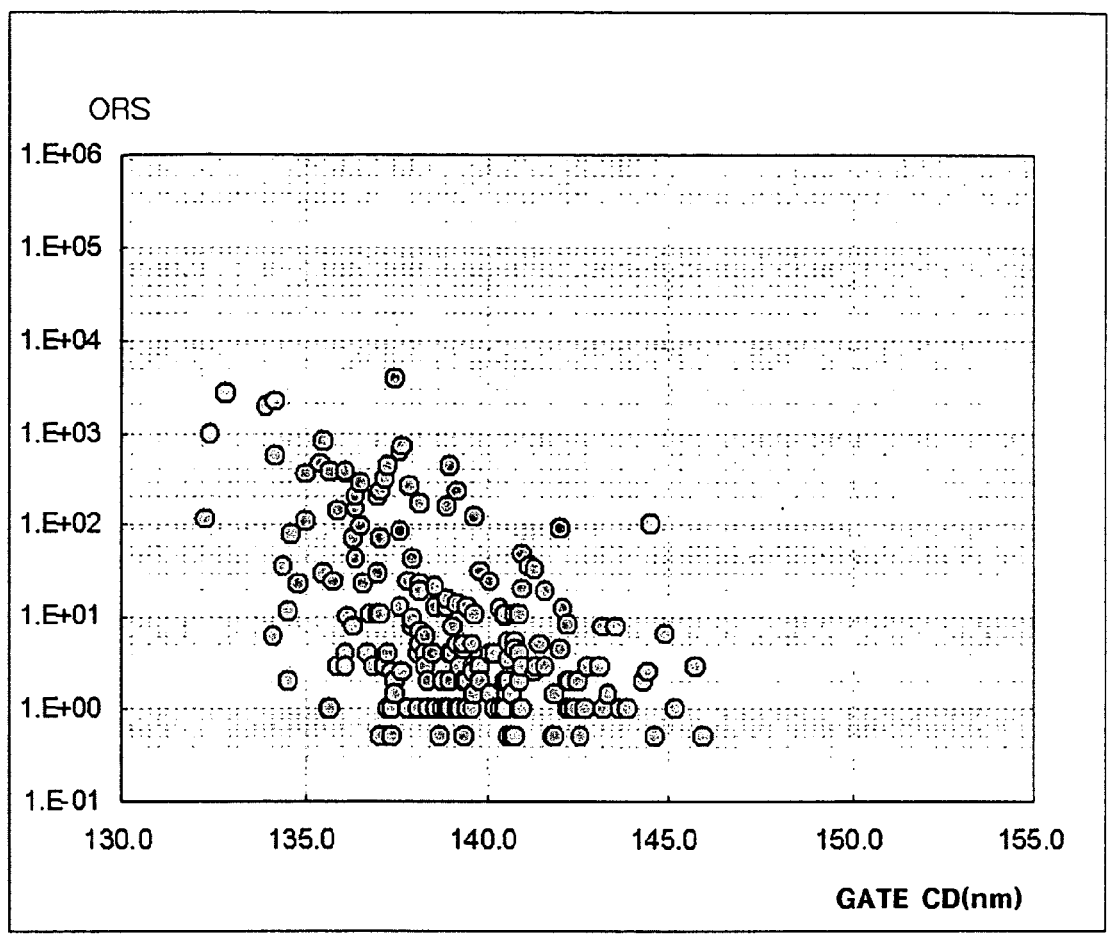
FIG. 8A is a graph illustrating the relationship between the variation of the CD of the gate electrode and a static refresh failure (XMH)
Figure 8B:
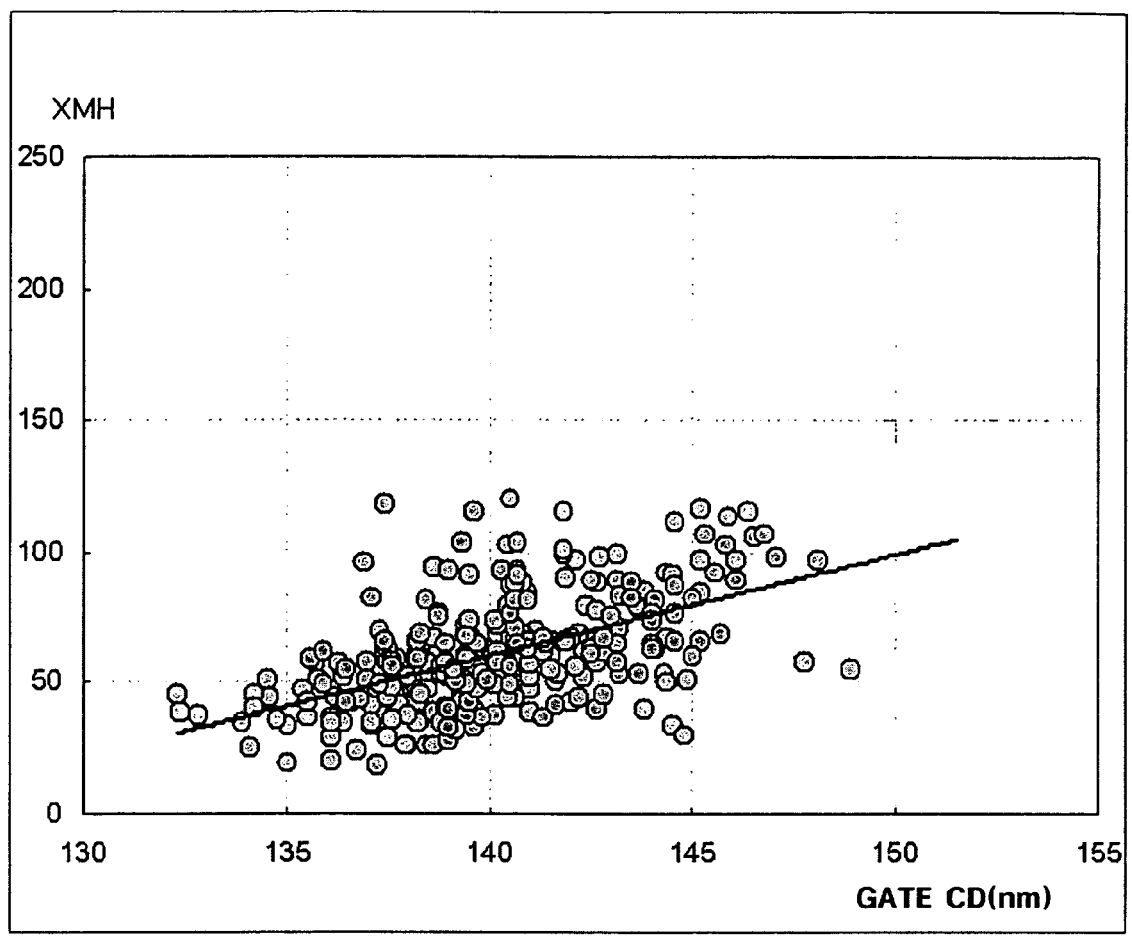
FIG. 8B is a graph illustrating the relationship between the variation of critical dimension (CD) of a gate electrode and a dynamic refresh failure (ORS).

FIG. 8A is a graph illustrating the relationship between the variation of the CD of the gate electrode and a dynamic refresh failure, and FIG. 8B is a graph illustrating the relationship between the variation of critical dimension (CD) of a gate electrode and a static refresh failure.

Referring to FIG. 8A, smaller values of the CD of a gate electrode tends to result in higher octal row stripe (ORS) values. The ORS is an indicator of a dynamic refresh failure that may occurs in association with the operation of a transistor. The ORS is a value indicating whether data of a second transistor is affected by a first transistor, which is adjacent to the second transistor, when reading the data of the second transistor while repeatedly writing data into and then erasing the data from the first transistor, i.e., a value indicating whether the data of the second transistor is affected by the data of the first transistor. When the ORS is set to a high value, the second transistor is turned on whenever the first transistor operates because the second transistor has a low threshold voltage. Therefore, the ORS should be maintained so that it is no more than one bit in considering yield.

Referring to FIG. 8B, the larger the CD of a gate electrode, the higher the X march (XMH). The XMH is an indicator of a static refresh failure that may occur regardless of the operation of a transistor. The XMH is a value indicating the number of bits from which a value of "0" is read, when writing a value of "1" into each of a plurality of cells and then reading data from the plurality of cells at a speed of 100-160 ms. If the XMH has a value of 70 or higher, in other words, if a value of "0" is read from 70 or more bits, it may adversely affect the yield. When the XMH has a high value, the transistor may have a large leakage current or a high threshold voltage, in which case, the transistor may not operate well, or a capacitor, which constitutes a memory cell together with the transistor, may have small capacitance.

As shown in FIGS. 8A and 8B, if a measured CD is smaller than a target CD, the threshold voltage of the transistor may become too low, and thus, a failure may occur, in which case, it is necessary to increase the threshold voltage of the transistor. On the other hand, if the measured CD is larger than the target CD, the threshold voltage of the transistor may become too high, and thus another failure may also occur, in which it is necessary to lower the threshold voltage of the transistor.

Figure 9:
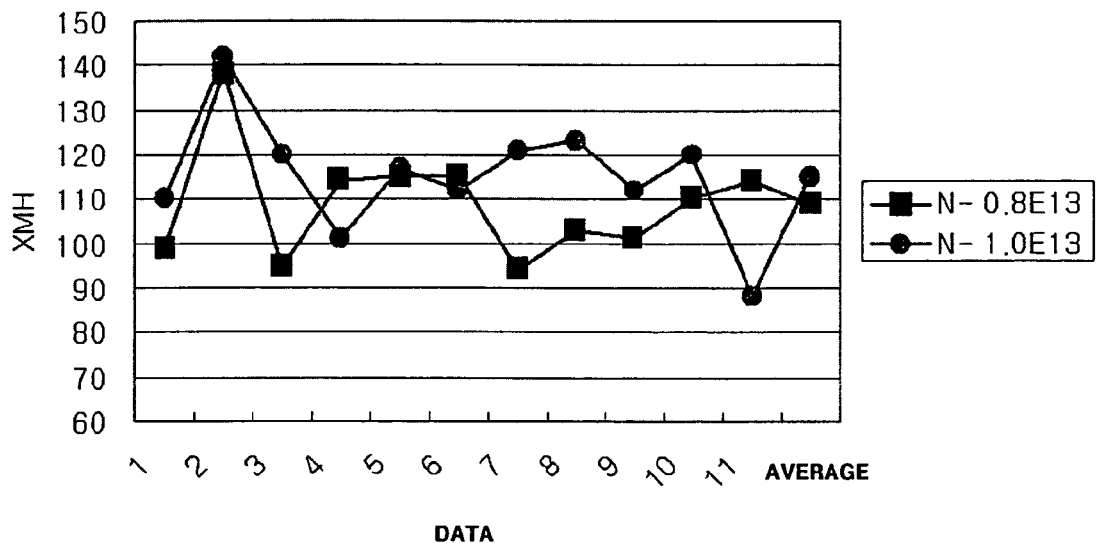
FIG. 9 is a graph illustrating X march (XMH) variation with respect to the variation of the dose of ions implanted into an N-type lightly doped drain (LDD) region.

In order to adjust the threshold voltage of the transistor, a dose of ions implanted into an n-type LDD region can be adjusted. However, given that an ion implantation dose of 0.8E13 (atoms/cm$^2$) results in an XMH average of 109, and an ion-implantation dose of 1.0E13 results in an XMH average of 115, as shown in FIG. 9, XMH always has a value more than 70 regardless of whether an ion implantation dose is varied. In short, the threshold voltage of the transistor is not improved as much as expected. FIG. 9 is a graph illustrating XMHs measured for eleven (11) wafers sampled from a plurality of wafers, on which transistors are formed with a target CD of 144 nm and a manufacturing specification of 144±5 nm, when an ion implantation dose is 0.8E13 or 1.0E13, and a gate CD is 148 nm.

If a measured CD is smaller than a target CD, increasing a dose of impurity ions implanted into an n-type LDD region in order to control a threshold voltage of a transistor may result in a decrease of a size of a depleted area. As the size of the depleted area decreases, the intensity of an electrical field increases. An increase in the intensity of the electrical field causes a considerable amount of hot electrons to be generated, which results in a dramatic change in cell current. As shown in Table 1 below and FIG. 10, if a gate has a large CD, the possibility of an XMH failure occurring can be considerably reduced by increasing an SAC plug ion implantation dose.

TABLE 1

| CDs (nm) | XMHs for different SAC ion implantation doses (atoms/cm$^2$) | | |
|---|---|---|---|
| | 2E12 | 4E12 | 5E12 |
| 137 | 79 | 76 | 74 |
| 140 | 70 | 44 | 41 |
| 143 | 68 | 53 | 52 |
| 146 | 94 | 63 | 58 |
| 149 | 125 | 95 | 57 |

Figure 10:
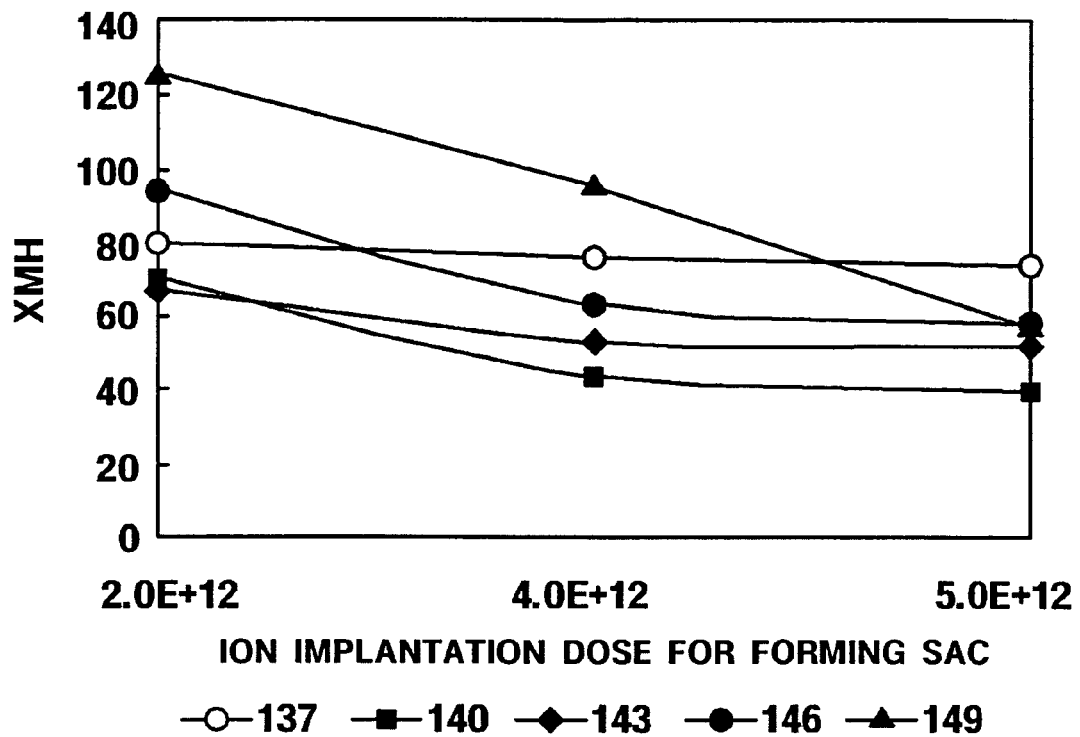
FIG. 10 is a graph illustrating XMH variations of gate electrodes with different CDs with respect to self-aligned contact (SAC) plug ion implantation dose variation.

Table 1 and FIG. 10 show that the threshold voltage of a transistor can be effectively controlled by controlling an SAC plug ion implantation dose.

Figure 11:
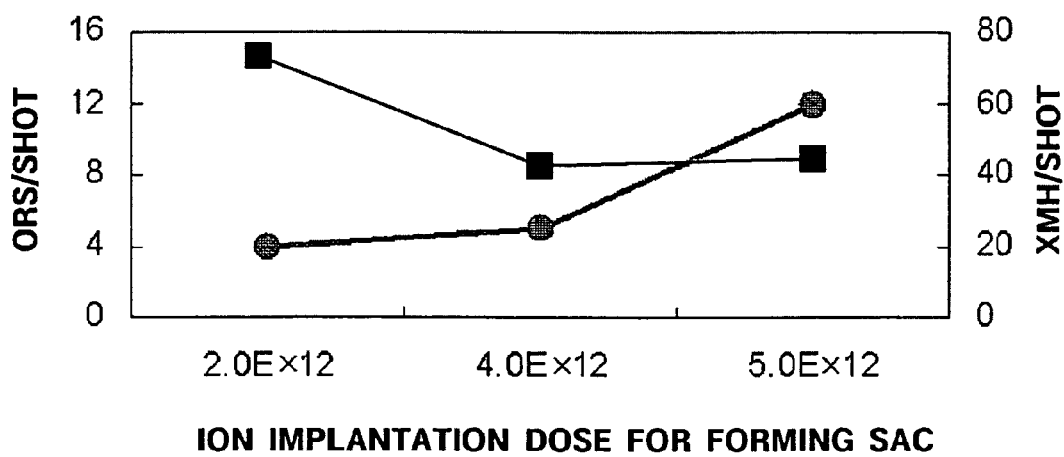
FIG. 11 is a graph illustrating XMH and octal row stripe (ORS) variations with respect to ion implantation dose variation when a gate electrode has a critical dimension of 138-140 nm.

Table 2 below and FIG. 11 show the relationship between a CD of a gate electrode and an SAC plug ion implantation dose in a case where the CD of the gate electrode ranges between 138 nm and 140 nm. XMH is always within a predetermined range regardless of whether an SAC ion implantation dose is 2.0E12, 4.0E12, or 5.0E12, while ORS increases when the SAC ion implantation dose is 5.0E12.

TABLE 2

| Failure types | 2.0E12 | 4.0E12 | 5.0E12 |
|---|---|---|---|
| ORS | 4 | 5 | 12 |
| XMH | 70 | 44 | 41 |

Figure 12:
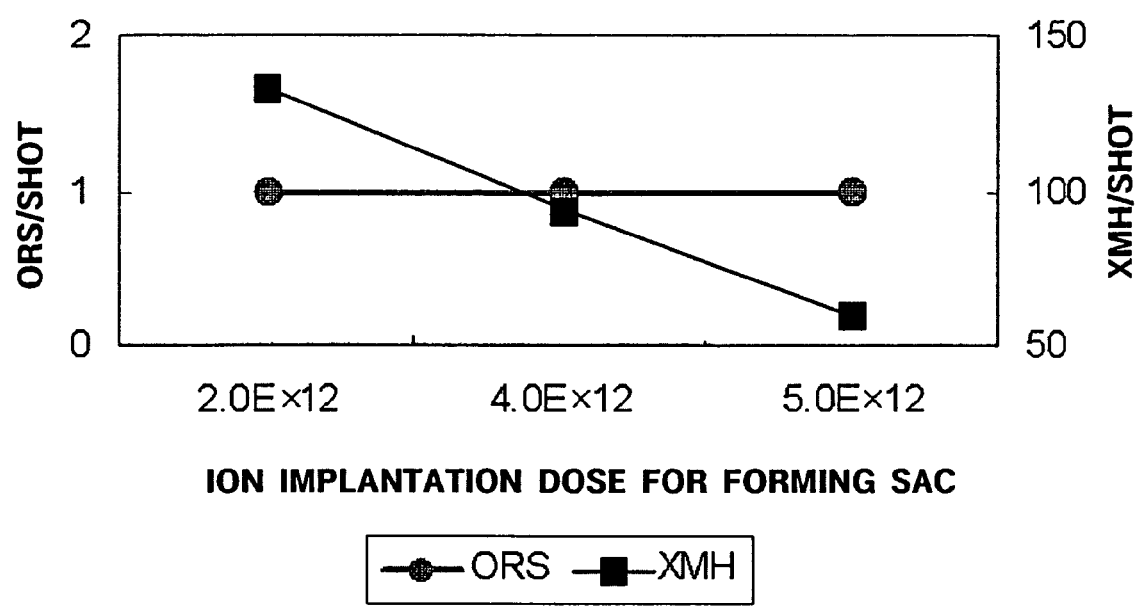
FIG. 12 is a graph illustrating XMH and ORS variations with respect to ion implantation dose variation when a gate electrode has a critical dimension of 147-149 nm.

Table 3 below and FIG. 12 show the relationship between a CD of a gate electrode and an SAC plug ion implantation dose in a case where the CD of the gate electrode ranges between 147 nm and 149 nm. When the SAC plug ion implantation dose increases, XMH decreases, but ORS becomes stabilized.

TABLE 3

| Failure types | 2.0E12 | 4.0E12 | 5.0E12 |
|---|---|---|---|
| ORS | 1 | 1 | 1 |
| XMH | 125 | 95 | 57 |

FIGS. 11 and 12 show that SAC plug ion implantation dose variation triggered by CD variation can be effectively controlled based on the range of the CD variation.

If a CD is small, an SAC plug ion implantation dose should be reduced to control the SAC plug ion implantation dose variation.

Figure 13:
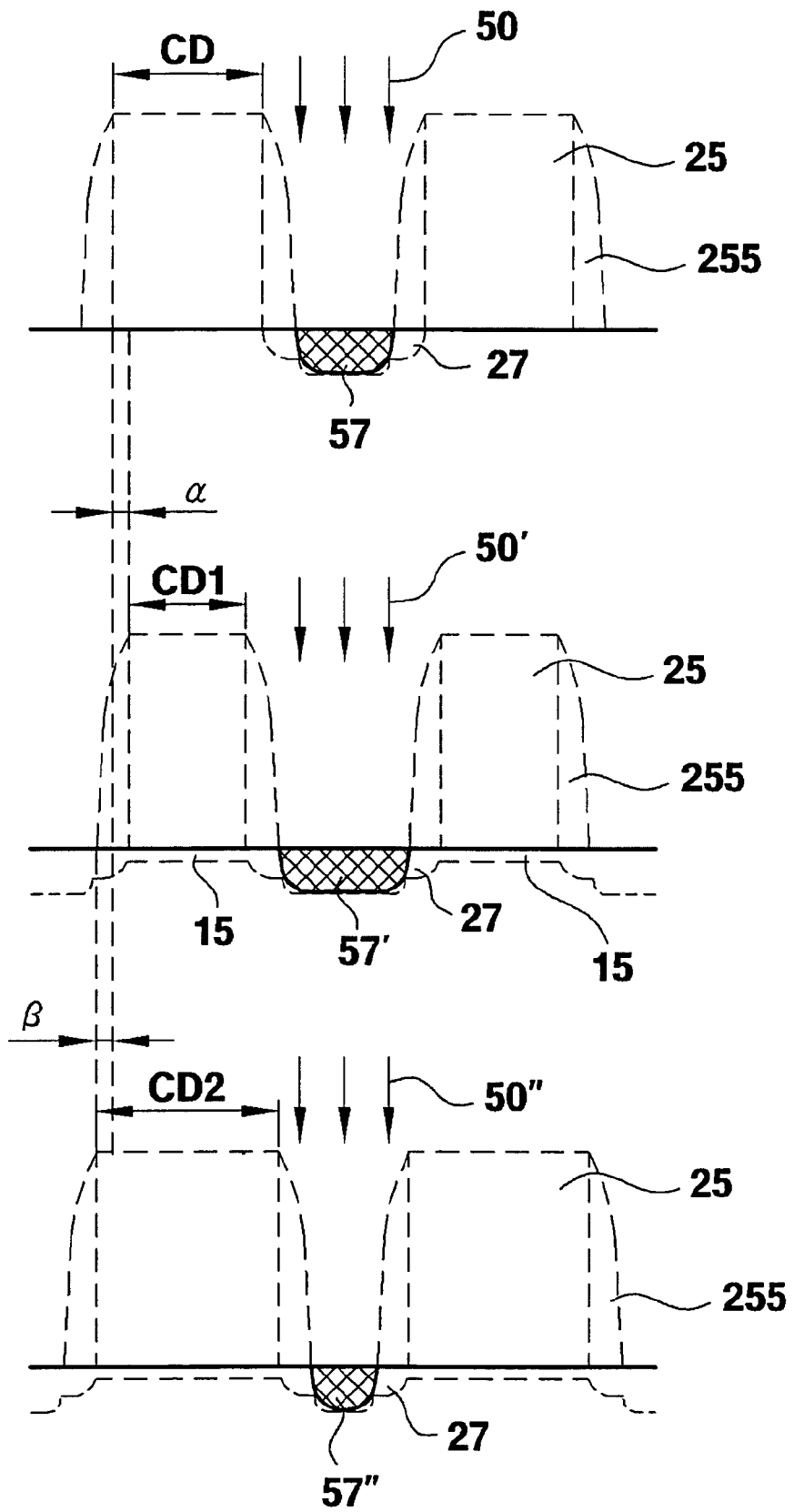
FIG. 13 is a schematic cross-sectional view illustrating how an SAC plug ion implantation dose affects threshold voltage control.

Otherwise, the SAC plug ion implantation dose is increased to control the SAC plug ion implantation dose variation. The reason that the SAC plug ion implantation dose should be reduced or increased depending on whether the CD is small or large may become more apparent with reference to FIG. 13.

As described above, a transistor having a gate electrode 25 with a first CD (CD1), which is smaller than a target CD (CDT) by α, has a lower threshold voltage than a transistor having a gate electrode with the target CD (CDT). Therefore, an SAC plug area 57' should be formed by implanting ions 50' with a smaller dose than the one set for the transistor having the gate electrode with the target CD ($CD_T$), in which case, the diffusivity of ions in the SAC plug area 57' is lower than the diffusivity of ions in an SAC plug area 57 of the transistor having the gate electrode 25 with the target CD ($CD_T$). Consequently, the counter-doping possibility of p-type ions, which control a threshold voltage of the transistor having the gate electrode 25 with the first CD (CD1) when implanted into a channel area 15 of the corresponding transistor, decreases. Accordingly, the amount of p-type ions in the channel area 15 is larger than that of the uppermost transistor having the gate electrode 25 with the target CD ($CD_T$), and thus the threshold voltage of the corresponding transistor increases. In short, it is possible to compensate for a decrease in the threshold voltage of a transistor caused by a decrease in the CD of a gate electrode of the transistor.

Likewise, a transistor having a gate electrode 25 with a second CD (CD2), which is larger than the target CD ($CD_T$) by β, has a higher threshold voltage than the transistor having the gate electrode with the target CD ($CD_T$). Therefore, an SAC plug area 57" should be formed by implanting ions 50" with a larger dose than the one set for the transistor having the gate electrode with the target CD ($CD_T$), in which case, the diffusivity of ions in the SAC plug area 57" is higher than the diffusivity of the ions in the SAC plug area 57 of the transistor having the gate electrode 25 with the target CD ($CD_T$). Consequently, the counter-doping possibility of p-type ions, which control the threshold voltage of the transistor having the gate electrode 25 with the second CD (CD2) when implanted into a channel area 15 of the corresponding transistor, increases. Accordingly, the amount of p-type ions of the channel area 15 is relatively smaller than the amount of p-type ions of the uppermost transistor having the gate electrode 25 with the target CD ($CD_T$), thus decreasing the threshold voltage of the corresponding transistor. In short, it is possible to compensate for an increase in the threshold voltage of a transistor caused by an increase in the CD of a gate electrode of the transistor.

Figure 14:
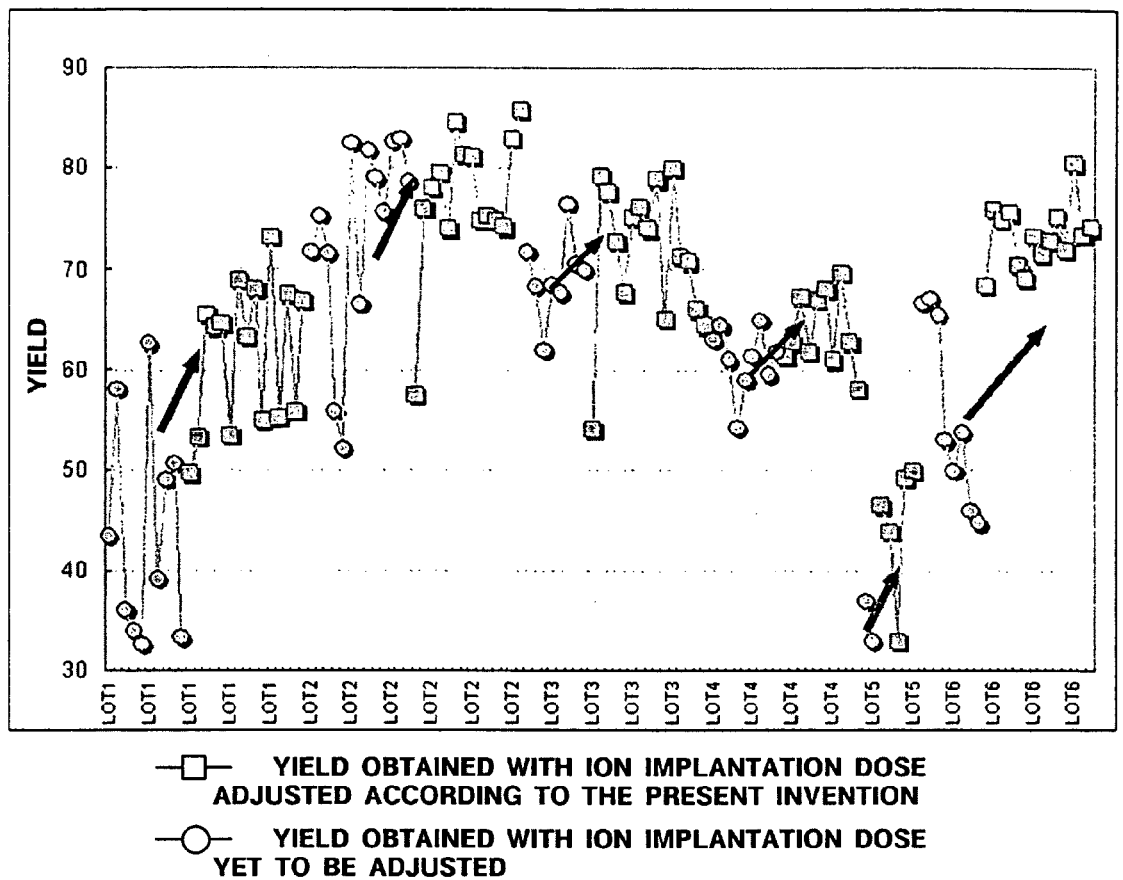
FIG. 14 is a graph comparing a yield obtained when SAC plug ion implantation is performed with an ion implantation dose adjusted according to the present invention with a yield obtained when the SAC plug ion implantation is performed with the ion implantation dose fixed.

FIG. 14 is a graph comparing yield obtained when ion implantation is performed with an ion implantation dose adjusted according to an aspect of the present invention with yield obtained when the ion implantation is performed with the ion implantation dose yet to be adjusted. Referring to FIG. 14, yield can be considerably increased by performing ion implantation with an adjusted ion implantation dose.

In the above exemplary embodiments of the present invention, threshold voltage variation caused by the CD variation of a gate electrode can be effectively controlled, and thus it is possible to manufacture transistors having satisfactory performance. Variation of a junction contact plug ion implantation does not severely result in a cell current variation. Accordingly, the dose of a junction contact plug ion implantation is easily adjusted. Since in the present invention, a threshold voltage of a transistor is controlled at a final stage of the formation of the transistor, i.e., after a junction area of the transistor is formed, all defects that may have occurred in the transistor may be occurred in the previous manufacturing steps can be repaired, thus enhancing manufacturing margins.

Although preferred embodiments of the present invention have been described in detail above, it is to be understood that various modifications and changes may be made to a person skilled in the art without departing from the scope and spirit of the invention. Therefore, it is intended that the following claims be interpreted to embrace all such modifications and changes and, accordingly, the specification and drawings are to be regarded in an illustrative rather than a restrictive sense.

What is claimed is:

1. A method of manufacturing an electronic device comprising:
   measuring a critical dimension (CD) of a gate electrode formed on a wafer;
   adjusting an ion implantation recipe to form a junction contact plug of a transistor formed on the wafer, based on the measured CD; and
   implanting ions into the wafer to form the junction contact plug using the adjusted ion implantation recipe.

2. The method of claim 1, wherein in the adjusting of the ion implantation recipe, the ion implantation recipe is adjusted to compensate for a threshold voltage variation caused by a difference between a target CD and the measured CD.

3. The method of claim 1, wherein the ion implantation recipe comprises an ion implantation dose.

4. The method of claim 1, wherein the CD of the gate electrode is a line width of the gate electrode.

5. The method of claim 1, wherein the measuring of the CD comprises:
   forming gate electrodes on the wafer;
   determining a plurality of measurement positions on the wafer;
   measuring CDs of two or more adjacent gate electrodes at each of the plurality of measurement positions and then averaging the measured CDs to obtain an average CD at each of the plurality of measurement positions; and obtaining a final CD by averaging the average CD at each of the plurality of measurement positions.

6. The method of claim 5, wherein obtaining the average CD at each of the plurality of measurement positions comprises:

measuring CDs of four adjacent gate electrodes at each of the plurality of measurement positions; and averaging the CDs of the four adjacent gate electrodes at each of the plurality of measurement positions.

7. The method of claim 1, wherein the adjusted ion implantation recipe is selected from a set of discrete ion implantation recipes that are quantified to compensate for a threshold voltage of the transistor with respect to each of a plurality of equally divided sections obtained by dividing a maximum CD variation range within a manufacturing specification range with a constant interval.

8. The method of claim 1, wherein the ion implantation recipe is an output value obtained when the measured CD is input to a mathematical model to make a threshold voltage of the transistor with the measured CD to be the same as the threshold voltage of the transistor with a target CD.

9. The method of claim 8, wherein the mathematical model is the equation $$\text{Junction contact plug ion implantation dose} = ((0.5 \times \text{measured } CD \text{ of gate electrode(nm)}) - 67.3) \times E12.$$

10. The method of claim 1, wherein the measuring the CD is performed by a measurement device, and the adjusting the ion implantation recipe is performed by an ion implanter controller adapted to adjust the ion implantation recipe to form a junction contact plug of a transistor by using the measured CD.

11. The method of claim 1, wherein the implanting ions comprises:

forming a junction area of the transistor in the wafer;

forming an insulation layer on the wafer;

forming a contact hole in the insulation layer to expose the junction area therethrough; and forming the junction contact plug of the transistor by implanting ions into the junction area exposed by the contact hole with the adjusted ion implantation recipe.

12. The method of claim 1, wherein the implanting ions comprises:

forming spacers at sidewalls of the gate electrode and forming a junction area of the transistor in the wafer;

forming an insulation layer on the wafer;

forming a self-aligned contact hole self-aligned with the spacer in the insulation layer to expose the junction area therethrough; and forming the junction contact plug of the transistor by implanting ions into the junction area exposed by the self-aligned contact hole with the adjusted ion implantation recipe.

13. The method of claim 1, wherein the gate electrode is a gate electrode of a memory cell of a DRAM, an SRAM, a flash memory, an FRAM, an MRAM, a PRAM, or any combination thereof.

14. An ion implanter controller comprising:

a measurement device adapted to measure a CD of a gate electrode formed on a wafer;

an ion implantation recipe adjustment unit structured and arranged to adjust an ion implantation recipe to form a junction contact plug of a transistor based on the measured CD of the gate electrode; and a transmission unit structured and arranged to transmit an operational command modified according to the adjusted ion implantation recipe to an ion implanter.

15. The ion implantation controller of claim 14, wherein the ion implantation recipe adjustment unit is adapted to compensate for a threshold voltage variation caused by a difference between a target CD and the measured CD.

16. The ion implantation controller of claim 14, wherein the ion implantation recipe comprises an ion implantation dose.

17. The ion implantation controller of claim 14, wherein the CD of the gate electrode is a line width of the gate electrode.

18. The ion implantation controller of claim 14, wherein the ion implantation recipe adjustment unit comprises:

an input unit adapted structured and arranged to receive CDs of two or more adjacent gate electrodes measured at each of a plurality of measurement positions, which are measured by the measurement device;

a first calculation unit structured and arranged to average the CDs of the two or more adjacent gate electrodes corresponding to each of the plurality of measurement positions, and to average the resulting CD averages to obtain a final CD;

a second calculation unit structured and arranged to obtain a difference between the final CD and a target CD; and a recipe selection unit structured and arranged to select the ion implantation recipe from a set of discrete ion implantation recipes that are quantified to compensate a threshold voltage of the transistor with respect to each of a plurality of equally divided sections that may be obtained by dividing a maximum CD variation range within a manufacturing specification range with a constant interval.

19. The ion implantation controller of claim 14, wherein the ion implantation recipe adjustment unit comprises:

an input unit structured and arranged to receive CDs of two or more adjacent gate electrodes measured at each of a plurality of measurement positions, which are measured by a measurement device;

a first calculation unit structured and arranged to average the CDs of the two or more adjacent gate electrodes corresponding to each of the plurality of measurement positions, and to average the resulting CD averages to obtain a final CD; and a second calculation unit structured and arranged to use the final CD and is composed of a mathematical model that enables a threshold voltage to be the same as that of a target CD of the gate electrode.

20. The ion implantation controller of claim 14, wherein the gate electrode is a gate electrode of a memory cell of a DRAM, an SRAM, a flash memory, an FRAM, an MRAM, a PRAM, or any combination thereof.

21. An ion implantation system comprising:

a measurement device structured and arranged to measure a CD of a gate electrode formed on a wafer;

an ion implanter controller structured and arranged to adjust an ion implantation recipe to form a junction contact plug of a transistor based on the measured CD of the gate electrode, and to transmit an operational command modified according to the adjusted ion implantation recipe; and an ion implanter structured and arranged to perform junction contact plug ion implantation according to the operational command.

22. The ion implantation system of claim 21, wherein the ion implanter controller is adapted to adjust the ion implantation recipe to compensate for a threshold voltage variation caused by a difference between a target CD and the measured CD.

23. The ion implantation system of claim 21, wherein the ion implantation recipe comprises an ion implantation dose.

24. The ion implantation system of claim 21, wherein the CD of the gate electrode is a line width of the gate electrode.

25. The ion implantation system of claim 21, wherein the ion implanter controller comprises:
- an input unit structured and arranged to receive CDs of two or more adjacent gate electrodes measured at each of a plurality of measurement positions, which are collected by an equipment server, from a measurement device;
- a first calculation unit structured and arranged to average the CDs of the two or more adjacent gate electrodes corresponding to each of the plurality of measurement positions, and to average the resulting CD averages to obtain a final CD;
- a second calculation unit structured and arranged to obtain a difference between the final CD and a target CD; and
- a recipe selection unit structured and arranged to select the ion implantation recipe from a set of discrete ion implantation recipes that are quantified to compensate a threshold voltage of the transistor with respect to each of a plurality of equally divided sections that may be obtained by dividing a maximum CD variation range within a manufacturing specification range with a constant interval.

26. The ion implantation system of claim 21, wherein the ion implanter controller comprises:
- an input unit structured and arranged to receive CDs of two or more adjacent gate electrodes measured at each of a plurality of measurement positions, which are measured by the measurement device;
- a first calculation unit structured and arranged to average the CDs of the two or more adjacent gate electrodes corresponding to each of the plurality of measurement positions, and to average the resulting CD averages to obtain a final CD; and
- a second calculation unit structured and arranged to use the final CD and is composed of a mathematical model that enables a threshold voltage to be the same as that of a target CD of the gate electrode.

27. The ion implantation system of claim 21, wherein the gate electrode is a gate electrode of a memory cell of a DRAM, an SRAM, a flash memory, an FRAM, an MRAM, a PRAM, or any combination thereof.

* * * * *

UNITED STATES PATENT AND TRADEMARK OFFICE
CERTIFICATE OF CORRECTION

PATENT NO. : 7,537,940 B2
APPLICATION NO. : 11/053651
DATED : May 26, 2009
INVENTOR(S) : Young-Ho Lee et al.

Page 1 of 1

It is certified that error appears in the above-identified patent and that said Letters Patent is hereby corrected as shown below:

Column 6, line 23, the word "ACD" should read -- ΔCD --.

Signed and Sealed this

Eighth Day of September, 2009

David J. Kappos
*Director of the United States Patent and Trademark Office*